(12) United States Patent
Luo

(10) Patent No.: US 6,414,553 B1
(45) Date of Patent: Jul. 2, 2002

(54) POWER AMPLIFIER HAVING A CASCODE CURRENT-MIRROR SELF-BIAS BOOSTING CIRCUIT

(75) Inventor: Sifen Luo, Hartsdale, NY (US)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/942,125

(22) Filed: Aug. 30, 2001

(51) Int. Cl.[7] ................................................ H03F 3/04
(52) U.S. Cl. ........................................ 330/296; 330/288
(58) Field of Search ................................. 330/288, 296

(56) References Cited

U.S. PATENT DOCUMENTS

| | | | |
|---|---|---|---|
| 5,548,248 A | 8/1996 | Wang | 330/288 |
| 5,724,004 A * | 3/1998 | Reif et al. | 330/277 |
| 5,844,443 A | 12/1998 | Wong | 330/275 |
| 6,300,837 B1 * | 10/2001 | Sowlati et al. | 330/296 |
| 6,333,677 B1 * | 12/2001 | Dening | 330/296 |
| 6,344,775 B1 * | 2/2002 | Morizuka et al. | 330/288 |

OTHER PUBLICATIONS

US 000082, U.S. Ser. No. 09/536,946, Filed: Mar. 28, 2000.
US 000360, U.S. Ser. No. 09/730,657, Filed: Dec. 6, 2000.
US 000172, U.S. Ser. No. 09/621,525, Filed: Jul. 21, 2000.

* cited by examiner

*Primary Examiner*—Robert Pascal
*Assistant Examiner*—Henry Choe
(74) *Attorney, Agent, or Firm*—Steven R. Biren

(57) ABSTRACT

A power amplifier circuit includes an amplifying transistor and a dc bias circuit for biasing the amplifier transistor to obtain a conduction angle of at least about 180°. The dc bias circuit includes a self-bias boosting circuit which has a cascode current-mirror circuit having an output coupled to a control terminal of the amplifying transistor by a resistor, and a capacitor coupled from the cascode current-mirror circuit to a common terminal. The value of the capacitor can be selected to obtain the desired amount of self-bias boosting.

6 Claims, 2 Drawing Sheets

POWER AMPLIFIER HAVING A CASCODE CURRENT-MIRROR SELF-BIAS BOOSTING CIRCUIT

BACKGROUND OF THE INVENTION

The invention is in the field of transistor amplifier circuits, and relates more particularly to a power amplifier circuit having a cascode current-mirror self-bias boosting circuit.

Amplifiers of this general type are frequently used in high-frequency RF amplifiers, as well as in audio amplifiers and other applications. In order to obtain a linear input-output relationship and high operating efficiency, such amplifiers are typically operated with a conduction angle of about 180° (Class B) or slightly greater (Class AB) to avoid crossover distortion.

Typically, amplifiers of this type require a dc bias circuit to establish the quiescent bias current in the amplifier circuit to ensure operation in the Class B or Class AB mode. In the prior art, bias is typically provided by a fixed current source, as shown in U.S. Pat. No. 5,844,443, or else by an external supply, which can be set to a desired constant value to secure the quiescent current necessary to operate in the desired mode, as shown in U.S. Pat. No. 5,548,248.

However, in amplifiers of the type described above the average current drawn from the supply depends upon the input signal level. As the output power increases so does the average current in both the emitter and the base of the power transistor. This increased average current causes an increased voltage drop in the biasing circuitry and in ballast resistors (which are used to avoid hot-spotting and thermal runaway in transistors using an interdigitated design). This in turn reduces the conduction angle (i.e. the number of degrees out of 360° that the amplifier is conducting), and forces the amplifier deep into Class B or even Class C operation, thereby reducing the maximum power output. To avoid this power reduction, the amplifier must have a larger quiescent bias. In prior-art circuitry this inevitably leads to a higher power dissipation at low power output levels and therefore an undesirable tradeoff in operating characteristics.

A recent improvement in this art is disclosed in co-pending and commonly-assigned U.S. patent application Ser. No. 09/536,946, entitled Dynamic Bias Boosting Circuit For A Power Amplifier, filed on Mar. 28, 2000. This application discloses a solution to the problem discussed above which entails providing the power amplifier circuit with a dynamic bias boosting circuit to dynamically increase the bias of the power transistor as the output power increases by using a circuit that senses the input voltage to the amplifier and generates a dynamic bias boost as a function of the amplitude of this signal. The drawback to this solution is that it employs numerous active and passive components, thus not maximizing simplicity, compactness and economy of manufacture.

Another recent improvement in this area is disclosed in co-pending and commonly-assigned U.S. patent application Ser. No. 09/730,657 entitled Self-Boosting Circuit For A Power Amplifier, filed on Dec. 6, 2000. This application presents an improved self-bias boosting circuit having an RC coupling network between the DC bias circuit and the amplifying transistor while using a generic DC bias circuit.

A scheme for independently controlling quiescent current and bias impedance is disclosed in High-Frequency Amplifier Circuit With Independent Control Of Quiescent Current And Bias Impedance, co-pending and commonly-assigned U.S. patent application Ser. No. 09/621,525, filed on Jul. 21, 2000. Although this scheme is capable of achieving high power-added efficiency while maintaining linearity, it employs a rather complex circuit and contributes a significant level of noise to the output stage.

All of the foregoing references are hereby incorporated by reference in their entirety.

Accordingly, it would be desirable to have a power amplifier circuit which offers the advantages of optimum maximum output power and reduced power dissipation at low power levels. Additionally, the circuit should be able to set the amount of self-bias boosting so that the power transistor can be properly biased for high power output and linearity as the power output increases, while controlling the quiescent current in the power transistor. Finally, it would be desirable for such a circuit to be extremely simple and compact in design, and very economical to manufacture.

SUMMARY OF THE INVENTION

It is therefore an object of the present invention to provide a power amplifier circuit which provides improved maximum output power and less power dissipation at low power levels. It is a further object of the invention to provide a circuit which is able to set the amount of self-bias boosting so that the power transistor can be properly biased for high power output and linearity as the power output increases, while controlling the quiescent current in the power transistor. Yet a further object of the invention to provide a circuit which is both extremely simple and compact in design and which is very economical to manufacture.

In accordance with the invention, these objects are achieved by a new power amplifier circuit for amplifying an input signal and having a conduction angle of at least about 180°, the amplifier circuit including an amplifying transistor and a dc bias circuit for biasing the amplifier transistor to obtain the desired conduction angle. The dc bias circuit includes a self-bias boosting circuit which has a cascode current-mirror circuit having an output coupled to a control terminal of the amplifying transistor by a resistor, and a capacitor coupled from the cascode current-mirror circuit to a common terminal.

In a preferred embodiment of the invention, the cascode current-mirror circuit includes a first pair of transistors having main current paths connected in series, with the output of the current-mirror circuit being taken from a common point of this series connection, and a second pair of transistors having main current paths connected in series with a bias current source.

A power amplifier circuit in accordance with the present invention offers a significant improvement in that a particularly advantageous combination of features, including increased maximum output power, selectable self-bias boosting level, low-noise level, controllable quiescent current and reduced power dissipation at low power levels, can be obtained in an extremely simple, compact and economical configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
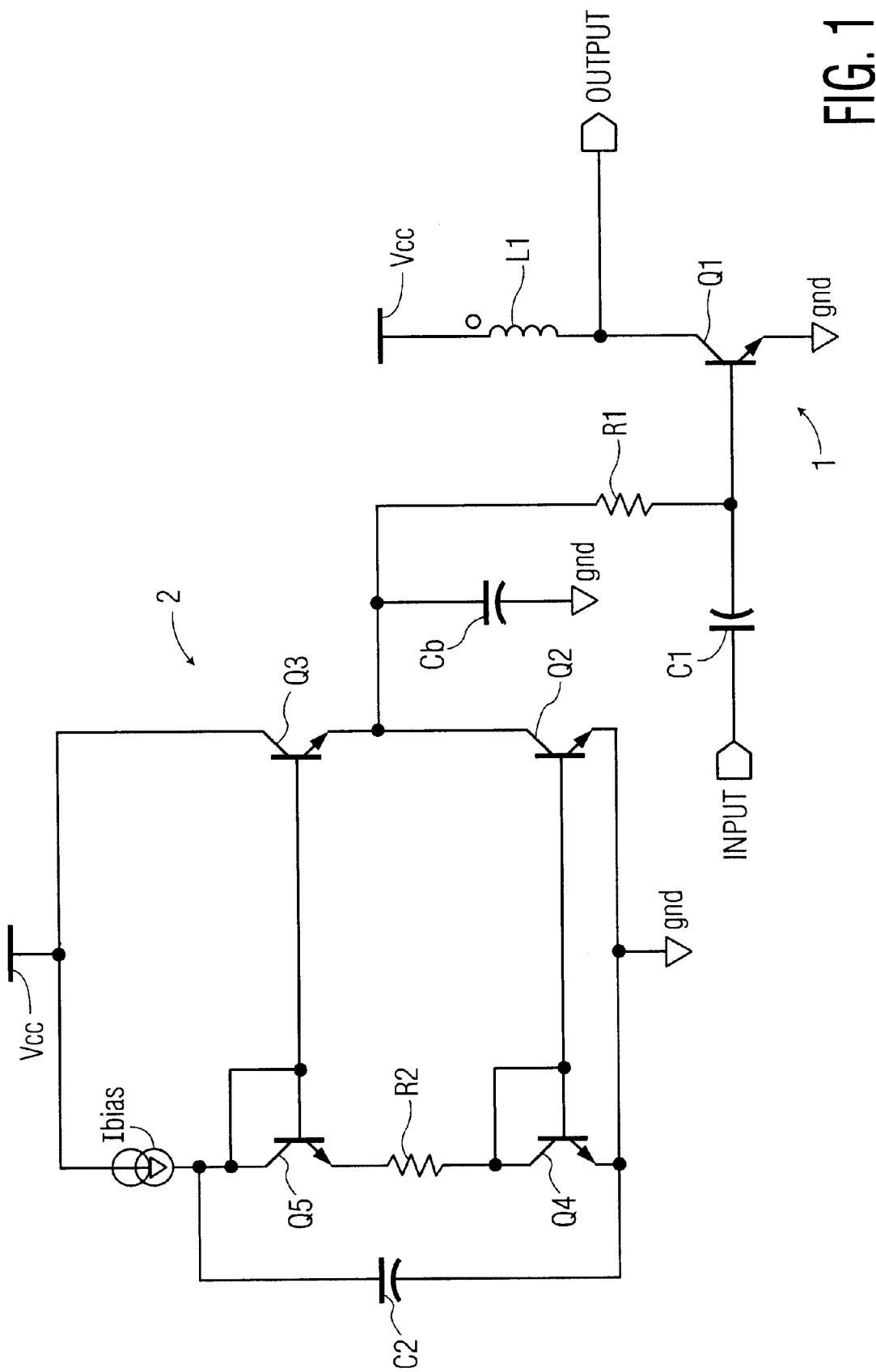
FIG. 1 shows a simplified schematic diagram of a power amplifier circuit in accordance with a first embodiment of the invention.

A simplified schematic diagram of a power amplifier circuit 1 is shown in FIG. 1 of the drawing. The amplifier circuit includes an amplifying transistor Q1 and a dc bias circuit 2 coupled to the base of the amplifying transistor Q1 by a resistor R1. The bias circuit 2 includes output bipolar transistors Q2 and Q3, coupled in series between $V_{cc}$ and a common terminal (gnd), with the common point of the transistors being coupled to the common terminal by capacitor Cb and to the base of transistor Q1 by resistor R1. The basic circuit configuration is completed by an input coupling capacitor C1 for coupling an input signal to the base of amplifying transistor Q1, with the transistor Q1 being connected in a common-emitter configuration and coupled between $V_{cc}$ and gnd by an inductor L1. The output of power amplifier circuit 1 is taken from the collector of transistor Q1.

In connection with the circuits shown, it should be understood that although the active components are shown as bipolar transistors for illustrative purposes, field effect transistors or a combination of bipolar and field effect transistors may alternatively be used within the scope of the invention. Additionally, it is to be understood that the power amplifier circuit 1 and bias circuit 2 may differ in form and detail from the simplified, illustrative depictions shown in the drawing. Furthermore, it is to be understood that the bias supply may be configured and adjusted to permit the amplifier circuit to operate in either Class B or Class AB mode.

The bias circuit comprises a cascode current mirror including transistors Q2 to Q5, resistors R1 and R2, and capacitors C2 and Cb. C2 is a bypass capacitor. The collector node of Q1 is the output node that is connected to a supply voltage through an external pull-up inductor L1. An RF input is applied to the base of Q1 through an AC coupling capacitor C1 that can be part of a matching circuit to a drive stage.

The current source Ibias in the bias circuit controls both the output drive current of the bias stage and the quiescent current of the power transistor. The mechanism by which Ibias controls the output drive current is straightforward because the bias circuit is a cascode current mirror circuit. The mechanism for controlling the quiescent current of Q1 can be explained as follows. Assume that all transistors in the circuits are identical and perfectly matched. Kirchoff's Law dictates that DC voltage Vbe(Q1)+V(R1)+Vbe(Q3) must be equal to Vbe(Q2)+V(R2)+Vbe(Q5). As Vbe(Q3) is approximately equal to Vbe(Q2), Vbe(Q1) is therefore approximately equal to Vbe(Q5) when V(R1) is set equal to V(R2) by properly choosing the resistance values. Therefore Ibias dictates the quiescent current in Q1 as well as the drive currents in Q2 and Q3.

By properly scaling the emitter area ratios between transistor pairs, the quiescent current in Q1 and drive currents in Q2 and Q3 can be made directly proportional to the value of Ibias. In the example given here, the ratios of 64 to 1 (Q1 to Q5) and 8 to 1 (Q2 to Q4 and Q3 to Q5) can be used.

The mechanism of the self-bias boosting of the bias circuit shown in FIG. 1 without Cb can be explained as follows. Q3 charges Q1 and Q2 discharges Q1 through the resistor R1. The discharging rate of Q2 is much faster than or equal to the charging rate of Q3 when the RF input power is low. As the RF input power increases, the discharging rate of Q2 becomes slower than the charging rate of Q3. Therefore the-average voltage across the forward-biased PN junction of Q1 increases.

Without Cb, the charging and discharging rates are difficult to control once the sizes of Q2 and Q3 and Ibias are fixed. This results in an uncontrolled bias boosting for Q1. The uncontrolled bias boosting may contribute too much average current and therefore cause a decrease in the efficiency of Q1, which will in turn decrease the overall power-added efficiency (PAE) of a power amplifier (PA) using the bias scheme.

With Cb, the charging and discharging rates can be adjusted to provide desirable bias boosting for achieving optimized output power, gain, PAE and linearity. The preferred way of implementing Cb is to use an off-chip surface-mount component. However, an on-chip capacitor can also be used to achieve the same purpose.

To achieve higher power-added efficiency (PAE), a linear power amplifier is commonly biased in class AB operation. Linearity and PAE are two contradictory requirements in the amplifier. A trade off between the linearity and PAE is needed for a given set of specifications for the amplifier. This is usually done by achieving the highest PAE for a given linearity requirement, for instance, the linearity requirement of adjacent-channel-power ratio (ACPR) in CDMA applications. This requires good control of the quiescent current of the amplifier.

In accordance with the invention, a cascode current-mirror circuit capable of providing self-bias boosting for the power transistor is used together with a capacitor as well as a bias resistor at the base of the power transistor as shown in FIG. 1 to provide a desired degree of self-bias boosting capability. The capacitor Cb adjusts the amount of self-bias boosting so that the power transistor can be properly biased for high output power and linearity as the output power increases. An additional advantage is that the quiescent current in the power transistor can be well controlled by the cascode current-mirror. Furthermore, the circuit of the present invention contributes less noise to the output stage of the power amplifier then the circuit of previously-mentioned U.S. Ser. No. 09/621,525.

In a nonlimitative illustrative example, the circuit of FIG. 1 was modeled with capacitor Cb values of 5.6 pF, 10 pF and 22 pF. It was established that the amount of self-bias boosting is indeed a function of the value of Cb, with the magnitude of the self-bias boosting increasing as the value of Cb increases. Thus, for a given application, the value of Cb can be selected to achieve the appropriate bias conditions for the desired trade off between PAE and linearity.

Figure 2:
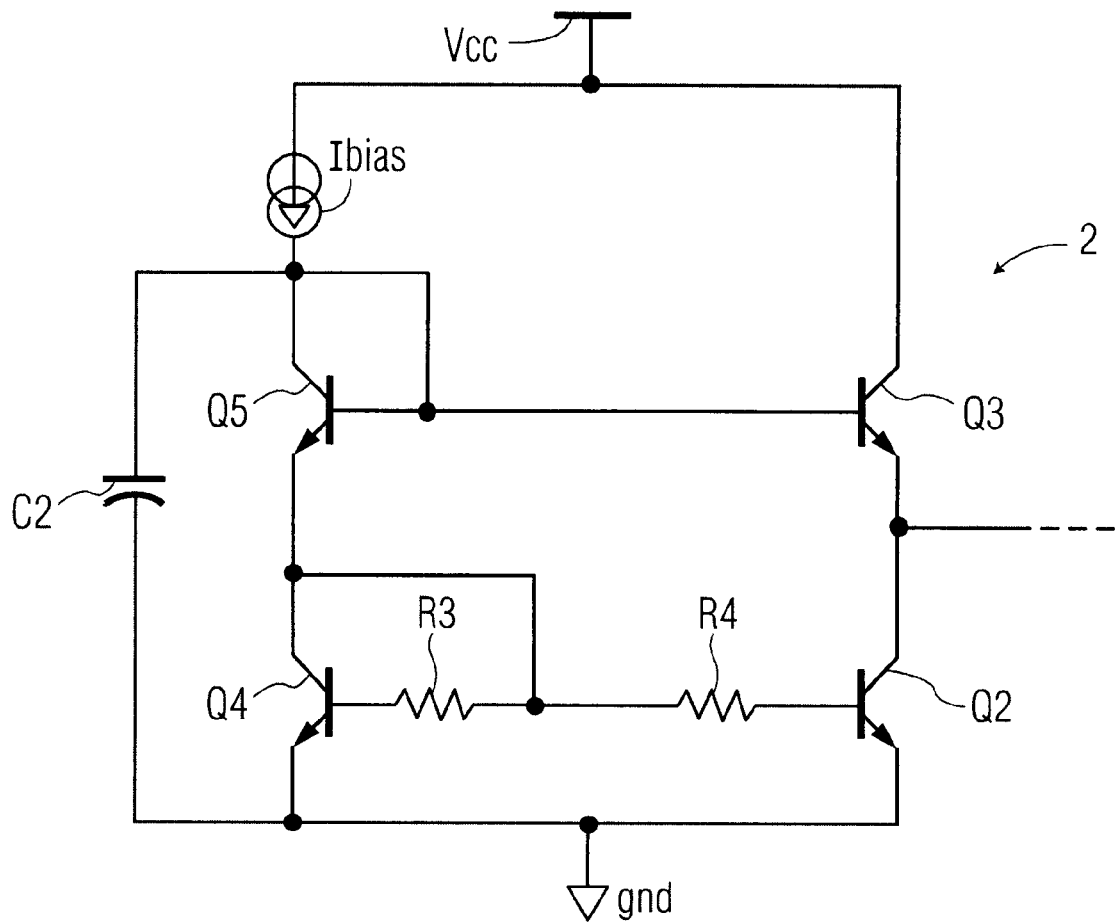
FIG. 2 shows a simplified schematic diagram of a dc bias circuit portion of a power amplifier circuit in accordance with a second embodiment of the invention.

An alternate embodiment of the dc bias circuit 2 is shown in FIG. 2. In FIG. 2, only the DC bias circuit 2 is shown for simplicity, and it will be understood that the connection between transistors Q2 and Q3 will be coupled to capacitor Cb and resistor R1 in the same manner as shown in FIG. 1. Furthermore, those portions of the circuit of FIG. 2 which are identical to the like portions of the circuit of FIG. 1 and previously described will not be described in further detail here.

FIG. 2 differs from FIG. 1 in that resistor R2 connected between transistors Q4 and Q5 has been eliminated, so that these transistors are now connected directly together, and in that resistors R3 and R4 have been inserted between the bases of transistors Q2 and Q4. The purpose of this alternate configuration is to improve circuit performance in applications requiring a low power supply voltage.

While the invention has been particularly shown and described with reference to several preferred embodiments thereof, it will be understood by those skilled in the art that various changes in form and detail, some of which have been suggested above, may be made without departing from the spirit or scope of the invention. Thus for example, different types of transistors may be employed, and alterations to the circuit configuration may be made to suit particular design requirement.

What is claimed is:

1. A power amplifier circuit for amplifying an input signal and having a conduction angle of at least about 180°, said power amplifier circuit comprising an amplifying transistor and a dc bias circuit for biasing said amplifying transistor to obtain said conduction angle, and said dc bias circuit having a self-bias boosting circuit comprising a cascode current-mirror circuit having an output coupled to a control terminal of said amplifying transistor by a resistor, and a capacitor coupled from the output of said cascode current-mirror circuit to a common terminal.

2. A power amplifier circuit as in claim 1, wherein said amplifier circuit is a Class AB amplifier circuit.

3. A power amplifier circuit as in claim 1, wherein said cascode current-mirror circuit comprises a first pair of transistors having main current paths connected in series, said output being taken from a common point of said series connection, and a second pair of transistors having main current paths connected in series with a bias current source.

4. A power amplifier circuit as claimed in claim 3, further comprising a resistor coupled in series with said second pair of transistors.

5. A power amplifier circuit as in claim 3, wherein a first transistor of said first pair and a first transistor of said second pair each have a main current path connected to said common terminal, and a resistor is connected in series with a control terminal of each first transistor.

6. A power amplifier circuit as in claim 1, wherein the value of the capacitor is chosen to obtain a desired amount of self-bias boosting.

* * * * *